United States Patent [19]
Anzawa et al.

[11] Patent Number: 5,929,733
[45] Date of Patent: Jul. 27, 1999

[54] MULTI-LAYER PRINTED SUBSTRATE

[75] Inventors: Seiichi Anzawa; Hisashi Itoh, both of Nagano, Japan

[73] Assignee: Nagano Japan Radio Co., Ltd., Nagano-ken, Japan

[21] Appl. No.: 08/555,794

[22] Filed: Nov. 9, 1995

Related U.S. Application Data

[63] Continuation of application No. 08/233,960, Apr. 28, 1994, abandoned.

[30] Foreign Application Priority Data

| Jul. 21, 1993 | [JP] | Japan | 5-201848 |
| Sep. 17, 1993 | [JP] | Japan | 5-254876 |

[51] Int. Cl.⁶ ............... H01F 27/08; H01F 27/30
[52] U.S. Cl. ............... 336/61; 336/83; 336/200; 336/232
[58] Field of Search ............... 336/83, 200, 232, 336/65, 61; 29/602.1

[56] References Cited

U.S. PATENT DOCUMENTS

| 4,012,703 | 3/1977 | Chamberlayne | 336/83 |
| 4,873,757 | 10/1989 | Williams | 29/602.1 |

FOREIGN PATENT DOCUMENTS

| 267108 | 5/1988 | European Pat. Off. | 336/200 |
| 318955 | 6/1989 | European Pat. Off. | 336/200 |
| 516456 | 12/1992 | European Pat. Off. | 336/200 |
| 5-82350 | 4/1983 | Japan | 336/200 |
| 58-67007 | 4/1983 | Japan | 336/200 |
| 3-183106 | 9/1991 | Japan . | |
| 5-121239 | 5/1993 | Japan | 336/200 |
| 5-152134 | 6/1993 | Japan | 336/200 |
| 993265 | 5/1965 | United Kingdom | 336/200 |
| 2250383 | 6/1992 | United Kingdom | 336/200 |

Primary Examiner—Thomas J. Kozma

[57] ABSTRACT

An area on which a coil part is formed on part of a substrate is secured, coil patterns are provided on a plurality of unit substrates corresponding to the area, the coil patterns of the laminated unit substrates are connected by a through hole to form the coil part, thereby resulting in miniaturization, reduction of the number of assembling processes, reduction of cost, noise prevention, and improvement of reliability. Heat radiation patterns are provided in unitary form on the coil patterns to secure a sufficient heat radiation property.

2 Claims, 4 Drawing Sheets

MULTI-LAYER PRINTED SUBSTRATE

This application is a continuation of application Ser. No. 08/233,960 filed on Apr. 28, 1994, now abandoned.

BACKGROUND OF THE INVENTION

I. Field of the Invention

This invention relates to multi-layer printed in which a plurality of unit substrates are laminated.

II. Description of the Background Art

Conventionally, heretofore known are coils using a plurality of sheet coils among coil parts using coils such as transformers and choke coils. For example, Japanese Patent Application Laid Open No. Hei-3-183106 in 1991 discloses the coil parts in which a plurality of printed substrates are formed thereon with circuit patterns being laminated.

Such conventional coil parts have finally been produced as completed independent electronics parts, therefore, the soldering is required for such coil parts to be mounted on upper surface of the printed substrate.

However, problems arise with regard to the printed substrate mounted with coil parts.

First, the independent coil parts formed separately in another way for the printed substrate are used, the whole printed substrate therefore comes thicker and larger in size together with the increased number of production processes for assembling including soldering.

Secondly, a circuit pattern of the printed substrate and coils of the coil parts include connections through terminal leads to provide an adverse effect of noise on using in a high-frequency circuit together with contact failure, thus disadvantage arises in view of reliability.

Third, the circuit patterns are printed on surface of the printed substrates, in addition, the circuit pattern is embraced on its two sides by the printed substrate, the resulted insufficient heat radiation of the circuit pattern introduces variation and deterioration with respect to its characteristics.

SUMMARY OF THE INVENTION

An object of the invention is to provide a multi-layer printed substrate capable of reducing the number of processes in assembling by realizing thinner thickness of the whole substrate to achieve miniaturization by preventing the assembling of independent coil parts on the substrate.

Another object of the invention is to provide a multi-layer printed substrate capable of raising reliability by eliminating the contact failure and preventing noise when using in the high-frequency circuit in that any of terminal leads of the coil parts is avoided.

Further another object of the invention is to provide a multi-layer printed substrate in which sufficient heat radiation of the coil patterns is secured to suppress fluctuation or deterioration of the characteristics and to obtain a stability of operation.

To achieve the object, according to the invention, an area A in which a coil part M is formed on part of the substrate is secured, coil patterns 3a, 3b, 3c - - - are provided on a plurality of unit substrates 2a - - - corresponding to the area A, and the coil patterns 3a - - - of the laminated unit substrate 2a - - - are connected by a through hole T to form the coil part M.

In this case, core inserting holes 4x, 4y, 4z are provided on the substrate, through which a core 5 of the coil part M is loaded. The core 5 is formed of a pair of divided cores 5p and 5q, and on loading the divided cores 5p and 5q are fixed together by a fixture member 6.

On the other hand, part of coil patterns 3a, 3b, 3c - - - are formed in a wider shape, one or two or more heat radiation patterns 7a, 7b - - - are provided in a unitary shape on the coil patterns 3a, 3b - - - . The heat radiation patterns 7a - - - can be provided on vacant spaces Aa, Ab - - - of the unit substrates 2a - - - , or the heat radiation patterns 7a - - - can be provided on part of one or two or more unit substrates 2b - - - which protrude from the substrate end. Furthermore, the heat radiation patterns 7a, 7b - - - provided on a plurality of unit substrates 2a, 2b - - - can be allowed to have different positions of surface direction.

In this arrangement, since part of the multi-layer printed substrate 1 is formed directly of a coil part M, in appearance the multi-layer printed substrate 1 itself is provided irrespective of the presence of the coil part M, and in addition no terminal lead is provided for the coil part. The core inserting holes 4x, 4y, 4z are provided on the substrate, this permits the core 5 to be loaded through the core inserting holes 4x - - - and to form the coil part M having the core.

The heat radiation patterns 7a, 7b - - - are provided in a unitary shape on a part of the coil patterns 3a, 3b - - - , thus heat generated in the coil patterns 3a, 3b - - - diverges through the heat radiation patterns 7a, 7b - - - to achieve an effective heat radiation. The heat radiation patterns 7a - - - are provided on the vacant spaces Aa, Ab - - - of the unit substrates 2a - - - , thus the vacant spaces Aa, Ab - - - in the unit substrates 2a - - - are effectively utilized. In the case where a part of the one or two or more unit substrates 2b - - - protrude from the substrate end and the heat radiation patterns 7b - - - are provided on the protruding unit substrates 2b - - - , then the heat radiation patterns 7a - - - directly contacts with atmospheric air to produce an effective heat radiation. Moreover, the heat divergence can be promoted in that differences are given to each position of the surface directions of the heat radiation patterns 7a, 7b - - - in a plurality of unit substrates 2a, 2b - - - .

DETAILED DESCRIPTION OF THE PREFERRED EMBODIMENTS

Embodiments according to the invention are described in detail in accordance with the drawings.

A multi-layer printed substrate 1 according to the preferred embodiment of the invention is described referring to FIGS. 1 to 6.

Figure 1:
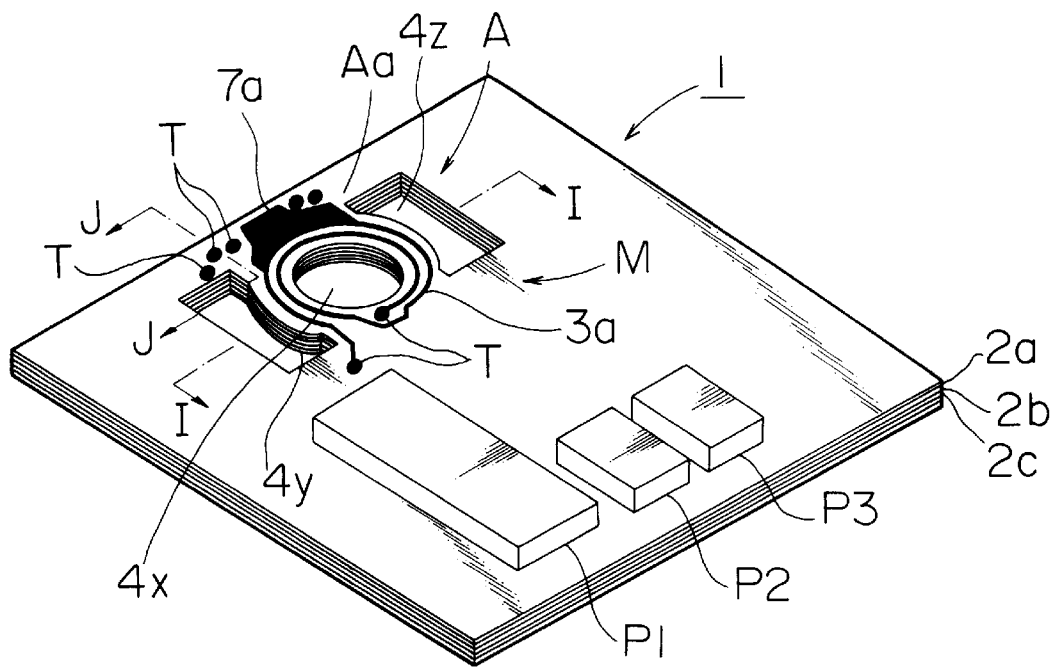
FIG. 1 is a perspective view of a multi-layer printed substrate according to the invention.
Figure 2:
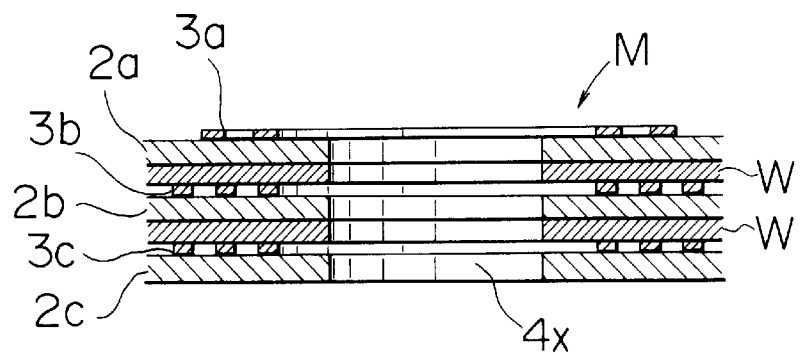
FIG. 2 is a sectional view taken along lines I—I in FIG. 1.
Figure 4:
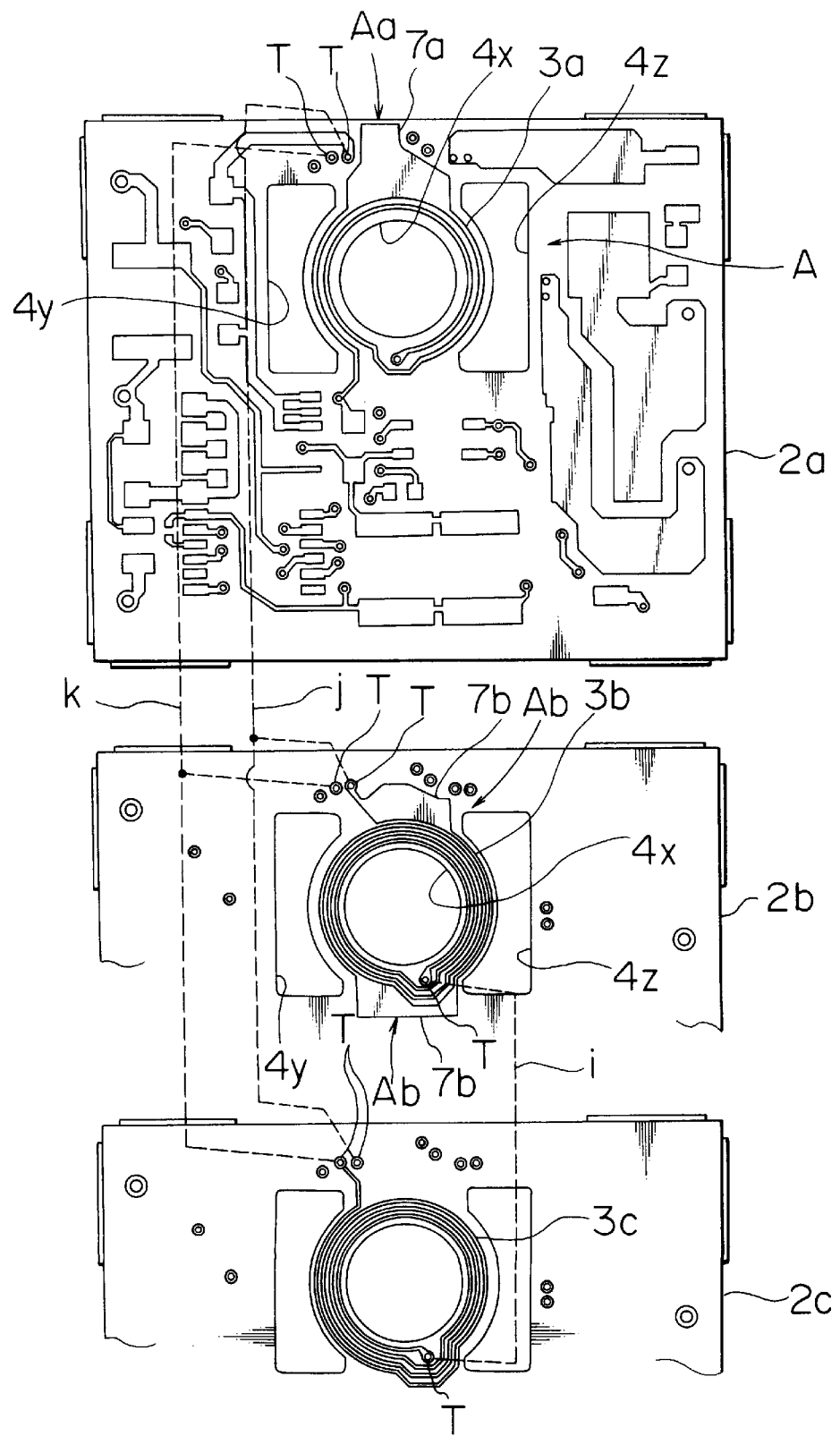
FIG. 4 is a plan view of each unit substrate in the multi-layer printed substrate.
Figure 5:
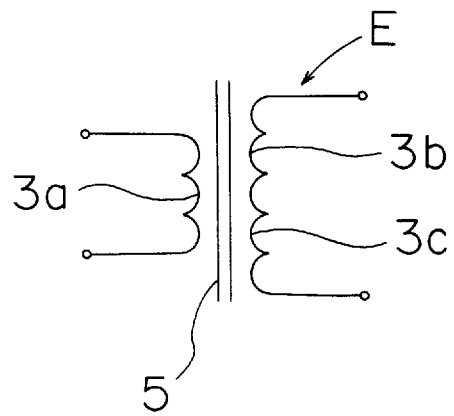
FIG. 5 is a view illustrating the numbers and symbols of coil parts in the multi-layer printed substrate.

The multi-layer printed substrate 1 is formed of a plurality of laminations of relatively thinner unit substrates 2a, 2b, 2c - - - each having a thickness of an extent of 0.2 mm as shown in FIG. 1. In FIG. 4, each unit substrate 2a, 2b, 2c is shown in an exploded view. On the multi-layer printed substrate 1, the unit substrates 2a - - - are, as shown in FIG. 2, sequentially laminated by inserting therebetween insulating plates W - - - being an adhesive agent of thickness of about 0.2 mm to form one laminated sheet. Therefore, the multi-layer printed substrate 1 is one sheet of a unit substrate with a whole thickness of an extent of several mm.

On the other hand, an area A is secured for forming a coil part M in part of the multi-layer printed substrate 1. In FIG. 1, the multi-layer printed substrate 1 is intrinsically used as an ordinary multi-layer printed substrate in which various kinds of electronics parts P1, P2, P3 - - - such as IC chips are surface mounted. However, according to the invention, the area A within a predetermined scope is secured on part of a mount surface in the multi-layer printed substrate 1, coil patterns 3a, 3b, 3c as shown in FIG. 4 are printed on each unit substrate 2a - - - corresponding to the area A. In this arrangement, the coil patterns 3a, 3b, 3c may preferably be provided on one-side of each unit substrate 2a - - - or on two sides of the same. In the embodiment, the coil patterns 3a, 3b, 3c provided only on the one-side of unit substrate 2a - - - have been described. For the arrangement, the same construction as in the coil patterns 3a, 3b, 3c - - - provided on one-side of the unit substrates 2a - - - may also be available for two sides of the same.

The coil patterns 3a, 3b - - - are partially widely formed to provide heat radiation patterns 7a, 7b - - - in one unitary form. The heat radiation patterns 7a - - - are formed in a shape where vacant spaces Aa, Ab - - - in the unit substrates 2a - - - are filled as shown in FIG. 4. Thus, heat generated in the coil patterns 3a, 3b - - - are diverged through the heat radiation patterns 7a, 7b - - - to achieve an effective heat radiation, in addition, the heat radiation patterns 7a - - - are provided in the vacant spaces Aa, Ab - - - of the unit substrates 2a - - - thereby to enable effective utilization of the vacant spaces Aa, Ab - - - in the unit substrate 2a - - - . The quantity of the heat radiation patterns 7a - - - provided in the coil patterns 3a, 3b - - - may preferably be equal to one or two or more. For example, the coil pattern 3b in FIG. 4 shows the case of providing the two heat radiation patterns 7a, 7b.

Figure 3:
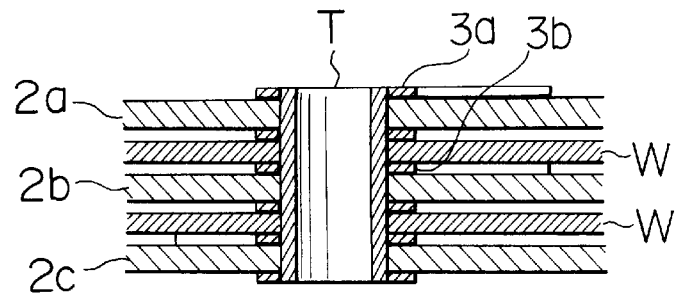
FIG. 3 is a sectional view taken along lines J—J in FIG. 1.

When laminating the unit substrates 2a - - - , as shown in FIG. 3, the coil patterns 3a - - - are connected by a through hole T, where the unit substrates 2a - - - provided with the coil patterns 3a - - - may preferably be all of the entire unit substrates 2a - - - or part of the same. Furthermore, the coil patterns 3a - - - provided with the through hole T may preferably be all of entire coil patterns 3a - - - or part of the same. In FIG. 4, dotted lines i, j, k designate portions which are connected by the through hole T - - - .

Figure 6:
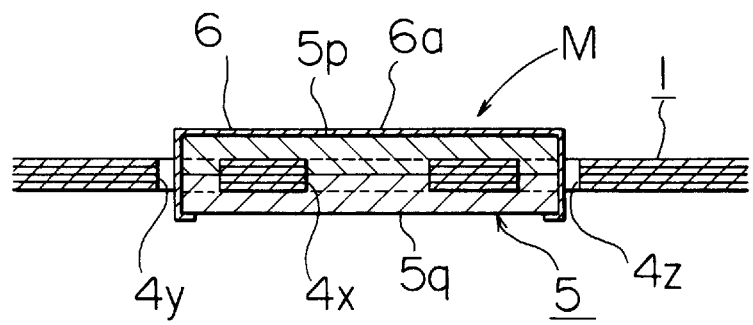
FIG. 6 is a vertical sectional view where cores are attached on coil parts in the multi-layer printed substrate.

On an inside and both out-sides of the coil patterns 3a - - - in the multi-layer printed substrate 1 are formed core inserting holes 4x, 4y, 4z respectively, through which a core 5 is loaded. On loading the core 5, divided cores 5p and 5q are used as shown in FIG. 6, in which the divided cores 5p and 5q are inserted into the core inserting holes 4x - - - from upper surface-side and lower surface-side of the multi-layer printed substrate 1 to produce one combined body which is fixed by a fixture member 6. FIG. 6 designates a C-character shaped fixture piece 6a embracing the periphery of the divided cores 5p and 5q as a fixture member 6. This directly forms the coil part M having a core 5 on part of the multi-layer printed substrate 1. The coil part M becomes a transformer E shown in FIG. 5.

In this way, in appearance the multi-layer printed substrate 1 itself is provided irrespective of the presence of the coil part M, the mount of the coil part separately prepared for the multi-layer printed substrate 1 is avoided by achieving miniaturization by reducing the whole thickness. A possibility of the contact failure is prevented together with a smaller adverse effect of noise even in using in the high-frequency circuit because no terminal lead is used in the coil parts.

Next, various kinds of modified examples and application examples according to the invention are described referring to FIGS. 7 to 10.

Figure 7:
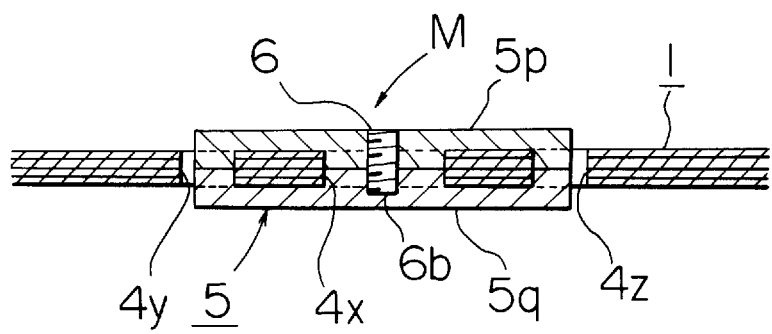
FIG. 7 is a vertical sectional view showing another embodiment where cores are attached on coil parts in the multi-layer printed substrate.

FIG. 7 shows another embodiment according to a loading pattern of the core 5. FIG. 7 shows the use of a fixing screw 6b made of ferrite as a fixture member 6 for affixing the combined divided-cores 5p and 5q to each other, where centers of the divided cores 5p and 5q are coupled by the fixing screw 6b. For such a fixture member 6, optional methods in addition to using adhesive agent or adhesive tape or the like may preferably be utilized.

Figure 8:
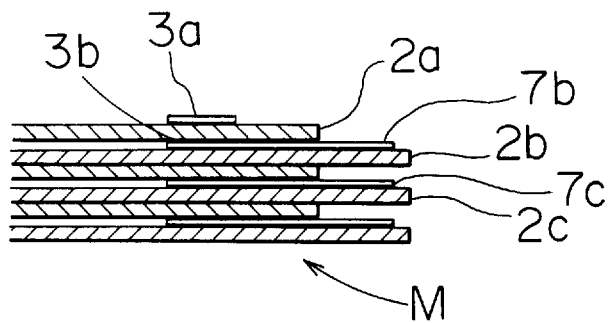
FIG. 8 is a partial vertical sectional view according to a modified embodiment of the multi-layer printed substrate.

FIG. 8 shows a modified embodiment of a multi-layer printed substrate 1. In the modified embodiment in FIG. 8, part of one or two or more unit substrates 2b, 2c - - - protruded from a substrate end, thus protruding unit substrates 2b - - - are provided with the heat radiation patterns 7b, 7c - - - , thereby the heat radiation patterns 7b - - - is directly in contact with atmospheric air to produce more efficient heat radiation. The protruding heat radiation patterns 7b - - - can be provided with a radiator such as fins with a high heat-conductivity etc.

Figure 9:
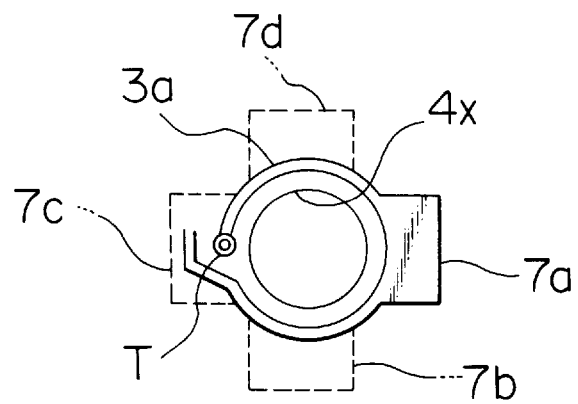
FIG. 9 is a partial vertical sectional view according to another modified embodiment of the multi-layer printed substrate.

FIG. 9 shows another modified embodiment of a multi-layer printed substrate 1. The modified embodiment in FIG. 9 is such that each different position of surface directions provided for the heat radiation patterns 7a, 7b, 7c, and 7d is provided on a plurality of unit substrates 2a - - - , thereby a higher heat-divergence is obtained.

Figure 10:
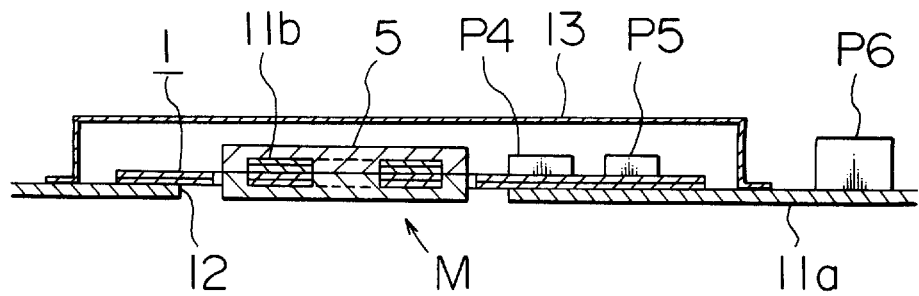
FIG. 10 is a vertical sectional view according to an application example of the multi-layer printed substrate.

FIG. 10 shows an application example using a multi-layer printed substrate 1. FIG. 10 shows a multi-layer printed substrate 1 mounted on the other printed substrate. A single layer printed substrate 11a is provided by an aluminum substrate and the like, the multi-layer printed substrate 1 can be soldered on the single layer printed substrate 11b by a surface mounting (reflow) system. In this system, the multi-layer printed substrate 1 can be used only for its required portions from among the whole printed substrate, thus a lower cost is realized for the entire printed substrate. A hole 12 is provided for containing hole for containing the core 5 of the multi-layer printed substrate 1 provided on the single layer printed substrate 11a.

An auxiliary printed substrate 11b is provided by using a multi-layer printed substrate provided with one or two or more coil patterns. The auxiliary printed substrate 11b can be formed in the same manner as in the coil part M in which the core 5 in the multi-layer printed substrate 1 is not loaded. The auxiliary printed substrate 11b is overlapped on the coil part M of the multi-layer printed substrate 1 to be soldered by the surface mounting (reflow) system. The largeness and shape of the core 5 to be loaded in this case are selected in consideration of the increase amount of thickness caused by adding the auxiliary printed ,substrate 11b. This facilitates the addition of coil patterns to the coil parts M in the multi-layer printed substrate 1, and raises the freedom of design or change of the coil parts M. In FIG. 10, a shield cover 13 is provided for covering the multi-layer printed substrate 1, P4, P5, P6 - - - which depict various kinds of electronics parts such as IC chips. In FIG. 10, the single layer printed substrate h1a and the auxiliary printed substrate 11*b* are both provided together. However, these may preferably be provided individually.

As hereinbefore fully described, the invention is not limited to such embodiments described. It is understood that the foregoing and changes may optionally be made therein without departing from the spirit of the invention with respect to the detail construction, shape, and the quantity and so forth.

What is claimed is:

1. A multi-layer printed circuit board comprising:

a plurality of laminated unit boards, an area secured on part of the multi-layer printed circuit board for forming a coil part, and printed circuit coil patterns provided on each of said plurality of unit boards corresponding to the area, wherein at least one protruding heat radiation pattern section is integrally formed on said coil patterns by widely forming part of said coil patterns such that the protruding heat radiation pattern section protrudes outwardly from an outermost portion of said coil patterns, wherein said protruding heat radiation pattern section is formed on an empty space of one of the plurality of unit boards, wherein said coil patterns of said laminated unit boards are connected by a through-hole to form a terminal for the coil part, wherein part of at least two of said plurality of laminated unit boards protrudes from an end of the multi-layer printed circuit board, at least a portion of the protruding heat radiation pattern section being exposed to air and not in contact with any other laminated unit board of the multi-layer printed circuit board and being formed on the protruding part of the laminated unit board.

2. A multi-layer printed circuit board comprising:

a plurality of laminated unit boards, an area secured on part of the multi-layer printed circuit board for forming a coil part, and printed circuit coil patterns provided on each of said plurality of unit boards correspondinc to the area, wherein at least one protruding heat radiation pattern section is integrally formed on said coil patterns by widely forming part of said coil patterns such that the protruding heat radiation pattern section protrudes outwardly from an outermost portion of said coil patterns, wherein said protruding heat radiation pattern section is formed on an empty space of one of the plurality of unit boards, wherein said coil patterns of said laminated unit boards are connected by a through-hole to form a terminal for the coil part, wherein the protruding heat radiation pattern is provided for each of the plurality of laminated unit boards and wherein the protruding heat radiation pattern sections protrude in different respective directions from one another.

* * * * *